United States Patent
Sievenpiper et al.

(10) Patent No.: US 6,739,028 B2
(45) Date of Patent: May 25, 2004

(54) MOLDED HIGH IMPEDANCE SURFACE AND A METHOD OF MAKING SAME

(75) Inventors: Daniel F. Sievenpiper, Los Angeles, CA (US); Joseph L. Pikulski, Westlake Village, CA (US); James H. Schaffner, Chatsworth, CA (US); Tsung-Yuan Hsu, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/905,794

(22) Filed: Jul. 13, 2001

(65) Prior Publication Data

US 2003/0010529 A1 Jan. 16, 2003

(51) Int. Cl.[7] .............................. H01G 7/00; C25D 5/02
(52) U.S. Cl. ........................ 29/25.42; 29/25.41; 29/831; 29/852; 29/841; 29/848; 29/857; 205/118; 205/122
(58) Field of Search ............................. 29/25.41, 25.42, 29/846, 831, 852, 841, 848, 857, 858; 361/311, 312, 333; 257/234; 205/118, 122, 131, 640, 668

(56) References Cited

U.S. PATENT DOCUMENTS

| | | | |
|---|---|---|---|
| 3,267,480 A | 8/1966 | Lerner | 343/911 |
| 3,810,183 A | 5/1974 | Krutsinger et al. | 343/708 |
| 3,961,333 A | 6/1976 | Purinton | 343/872 |

(List continued on next page.)

FOREIGN PATENT DOCUMENTS

| | | |
|---|---|---|
| DE | 196 00 609 A1 | 4/1997 |
| EP | 0 539 297 | 4/1993 |
| FR | 2 785 476 | 5/2000 |
| GB | 2 281 662 | 3/1995 |
| GB | 2 328 748 | 3/1999 |
| WO | 94/00891 | 1/1994 |
| WO | 96/29621 | 9/1996 |
| WO | 98/21734 | 5/1998 |
| WO | 99/50929 | 10/1999 |
| WO | 00/44012 | 7/2000 |

OTHER PUBLICATIONS

Bradley, T.W., et al., "Developmen.t of a Voltage–Variable Dielectric (VVD), Electronic Scan Antenna," *Radar 97*, Publication No. 449, pp. 383–385 (Oct. 1997).

Cognard, J., "Alignment of Nematic Liquid Crystals and Their Mixtures," *Mol. Crsyt. Liq, Cryst.*, Suppl. 1, 1 (1982) pp. 1–74.

Doane, J.W., et al., "Field Controlled Light Scattering from Nematic Microdroplets," *Appl. Phys. Lett.*, vol. 48, pp. 269–271 (Jan. 1986).

Ellis, T.J. and G.M. Rebeiz, "MM–Wave Tapered Slot Antennas on Micromachined Photonic Bandgap Dielectrics," *1996 IEEE MTT-S International Microwave Symposium Digest*, vol. 2, pp. 1157–1160 (1996).

Jensen, M.A., et al., "EM Interaction of Handset Antennas and a Human in Personal Communications," *Proceedings of the IEEE*, vol. 83, No. 1, pp. 7–17 (Jan. 1995).

(List continued on next page.)

*Primary Examiner*—A. Dexter Tugbang
*Assistant Examiner*—Tai Nguyen
(74) *Attorney, Agent, or Firm*—Ladas & Parry

(57) ABSTRACT

A high impedance surface and a method of making same. The surface includes a molded structure having a repeating pattern of holes therein and a repeating pattern of sidewall surfaces, the holes penetrating the structure between first and second major surfaces thereof and the sidewall surfaces joining the first major surface. A metal layer is put on said molded structure, the metal layer being in the holes, covering at least a portion of the second major surface, covering the sidewalls and portions of the first major surface to interconnect the sidewalls with other sidewalls via the metal layer on the second major surface and in the holes.

22 Claims, 9 Drawing Sheets

U.S. PATENT DOCUMENTS

| | | | | |
|---|---|---|---|---|
| 4,150,382 | A | 4/1979 | King | 373/754 |
| 4,266,203 | A | 5/1981 | Saudreau et al. | 333/21 |
| 4,308,541 | A | 12/1981 | Frosch et al. | 343/786 |
| 4,325,780 | A * | 4/1982 | Schulz | 156/659.1 |
| 4,387,377 | A | 6/1983 | Kandler | 343/756 |
| 4,594,595 | A | 6/1986 | Struckman | 343/770 |
| 4,737,795 | A | 4/1988 | Nagy et al. | 343/712 |
| 4,749,996 | A | 6/1988 | Tresselt | 343/700 |
| 4,758,459 | A * | 7/1988 | Mehta | 428/131 |
| 4,760,402 | A | 7/1988 | Mizuno et al. | 343/713 |
| 4,782,346 | A | 11/1988 | Sharma | 343/795 |
| 4,821,040 | A | 4/1989 | Johnson et al. | 343/700 MS |
| 4,835,541 | A | 5/1989 | Johnson et al. | 343/713 |
| 4,843,400 | A | 6/1989 | Tsao et al. | 343/700 |
| 4,843,403 | A | 6/1989 | Lalezari et al. | 343/767 |
| 4,853,704 | A | 8/1989 | Diaz et al. | 343/767 |
| 4,905,014 | A | 2/1990 | Gonzalez et al. | 343/909 |
| 5,021,795 | A | 6/1991 | Masiulis | 343/700 |
| 5,023,623 | A | 6/1991 | Kreinheder et al. | 343/725 |
| 5,081,466 | A | 1/1992 | Bitter, Jr. | 343/767 |
| 5,115,217 | A | 5/1992 | McGrath et al. | 333/219 |
| 5,146,235 | A | 9/1992 | Frese | 343/895 |
| 5,158,611 | A | 10/1992 | Ura et al. | 106/499 |
| 5,177,493 | A | 1/1993 | Kawamura | 343/713 |
| 5,193,256 | A * | 3/1993 | Ochiai | 29/25.35 |
| 5,208,603 | A | 5/1993 | Yee | 343/909 |
| 5,268,701 | A | 12/1993 | Smith | 343/767 |
| 5,287,118 | A | 2/1994 | Budd | 343/909 |
| 5,369,881 | A * | 12/1994 | Inaba | 29/846 |
| 5,402,134 | A | 3/1995 | Miller et al. | 343/742 |
| 5,519,408 | A | 5/1996 | Schnetzer | 343/853 |
| 5,525,954 | A | 6/1996 | Komazaki et al. | 333/219 |
| 5,531,018 | A | 7/1996 | Saia et al. | 29/622 |
| 5,532,709 | A | 7/1996 | Talty | 343/819 |
| 5,534,877 | A | 7/1996 | Sorbello et al. | 343/700 MS |
| 5,541,614 | A | 7/1996 | Lam et al. | 343/792.5 |
| 5,557,291 | A | 9/1996 | Chu et al. | 343/725 |
| 5,589,845 | A | 12/1996 | Yandrofski et al. | 343/909 |
| 5,611,940 | A | 3/1997 | Zettler | 73/514 |
| 5,638,946 | A | 6/1997 | Zavracky | 200/181 |
| 5,682,168 | A | 10/1997 | James et al. | 343/713 |
| 5,694,134 | A | 12/1997 | Barnes | 343/700 |
| 5,721,194 | A | 2/1998 | Yandrofski et al. | 505/210 |
| 5,818,394 | A | 10/1998 | Aminzadeh et al. | 343/713 |
| 5,847,454 | A * | 12/1998 | Shaw | 257/734 |
| 5,850,198 | A | 12/1998 | Lindenmeier et al. | 343/713 |
| 5,874,915 | A | 2/1999 | Lee et al. | 342/375 |
| 5,892,485 | A | 4/1999 | Glabe et al. | 343/789 |
| 5,894,288 | A | 4/1999 | Lee et al. | 343/770 |
| 5,917,458 | A | 6/1999 | Ho et al. | 343/909 |
| 5,923,303 | A | 7/1999 | Schwengler et al. | 343/767 |
| 5,929,819 | A | 7/1999 | Grinberg | 343/754 |
| 5,945,951 | A | 8/1999 | Monte et al. | 343/700 |
| 5,949,382 | A | 9/1999 | Quan | 343/767 |
| 6,005,519 | A | 12/1999 | Burns | 343/700 |
| 6,005,521 | A | 12/1999 | Suguro et al. | 343/700 MS |
| 6,037,912 | A | 3/2000 | DeMarre | 343/815 |
| 6,040,803 | A | 3/2000 | Spall | 343/700 |
| 6,046,655 | A | 4/2000 | Cipolla | 333/137 |
| 6,054,659 | A | 4/2000 | Lee et al. | 200/181 |
| 6,075,485 | A | 6/2000 | Lilly et al. | 343/700 |
| 6,081,235 | A | 6/2000 | Romanofsky et al. | 343/700 |
| 6,081,239 | A | 6/2000 | Sabet et al. | 343/753 |
| 6,091,367 | A | 7/2000 | Kabashima et al. | 343/700 MS |
| 6,097,263 | A | 8/2000 | Mueller et al. | 333/17.1 |
| 6,097,343 | A | 8/2000 | Goetz et al. | 343/708 |
| 6,118,406 | A | 9/2000 | Josypenko | 343/700 |
| 6,118,410 | A | 9/2000 | Nagy | 343/713 |
| 6,127,908 | A | 10/2000 | Bozler et al. | 333/246 |
| 6,154,176 | A | 11/2000 | Fathy et al. | 343/700 |
| 6,166,705 | A | 12/2000 | Mast et al. | 343/853 |
| 6,175,337 | B1 | 1/2001 | Jasper, Jr. et al. | 343/700 |
| 6,191,724 | B1 | 2/2001 | McEwan | 342/21 |
| 6,208,316 | B1 | 3/2001 | Cahill | 343/909 |
| 6,218,978 | B1 | 4/2001 | Simpkin et al. | 342/5 |
| 6,246,377 | B1 | 6/2001 | Aiello et al. | 343/770 |
| 6,261,963 | B1 * | 7/2001 | Zhao | 438/704 |

OTHER PUBLICATIONS

Jensen, M.A., et al., "Performance Analysis of Antennas for Hand-held Transceivers using FDTD," *IEEE Transactions on Antenna and Propagation*, vol. 42, No. 8, pp. 1106–1113 (Aug. 1994).

Linardou, I., et al., "Twin Vivaldi antenna fed by coplanar waveguide," *Electronics Letters*, vol. 33, No. 11, pp. 1835–1837 (Oct. 23, 1997).

Ramo, S., et al., *Fields and Waves in Communication Electronics*, 3rd edition (New York, John Wiley & Sons, 1994) Section 9 .8–9 .11, pp. 476–487.

Schaffner, J.H., et al., "Reconfigurable Aperture Antennas Using RF MEMS Switches for Multi-Octave Tunability and Beam Steering," *IEEE*, pp. 321–324 (2000).

Sievenpiper, D., et al., "Low-profile, four-sector diversity antenna on high-impedance ground plane," *Electronics Letters*, vol. 36, No. 16, pp. 1343–5 (Aug. 3, 2000).

Sievenpiper, D. and Eli Yablonovitch, "Eliminating Surface Currents with Metallodielectric Photonic Crystals," *1998 IEEE MTT-S International Microwave Symposium Digest*, vol. 2, pp. 663–666 (Jun. 7, 1998).

Sievenpiper, D., et al., "High-Impedance Electromagnetic Surfaces with a Forbidden Frequency Band," *IEEE Transactions on Microwave Theory and Techniques*, vol. 47, No. 11, pp. 2059–2074 (Nov. 1999).

Sevenpiper, D., "High-Impedance Electromagnetic Surfaces," *Ph.D. Dissertation*, Dept. of Electrical Engineering, University of California, Los Angeles, CA, 1999.

Wu, S.T., et al., "High Birefringence and Wide Nematic Range Bis-tolane Liquid Crystals," *Appl. Phys. Lett.*, vol. 74, No. 5, pp. 344–346 (Jan. 1999).

Balanis, C., "Aperture Antennas," *Antenna Theory, Analysis and Design*, 2nd edition, John Wiley & Sons, New York, Chap. 12, pp. 575–597 (1997).

Balanis, C., "Microstrip Antennas," *Antenna Theory, Analysis and Design*, 2nd edition, John Wley & Sons, New York, Chap. 14, pp. 722–736 (1997).

Perini, P. and C. Holloway, "Angle and Space Diversity Comparisons in Different Mobile Radio Environments," *IEEE Transactions on Antennas and Propagation*, vol. 46, No. 6, pp. 764–775 (Jun. 1998).

Vaughan, R., "Spaced Directive Antennas for Mobile Communication by the Fourier Transform Method," *IEEE Transactions on Antennas and Propagation*, vol. 48, No. 7, pp. 1025–1032 (Jul. 2000).

* cited by examiner

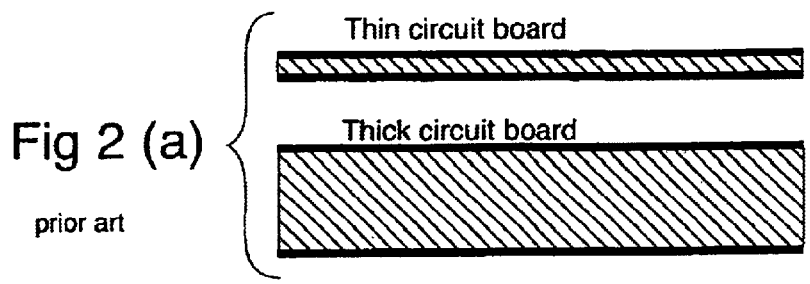
Fig 2 (a) prior art
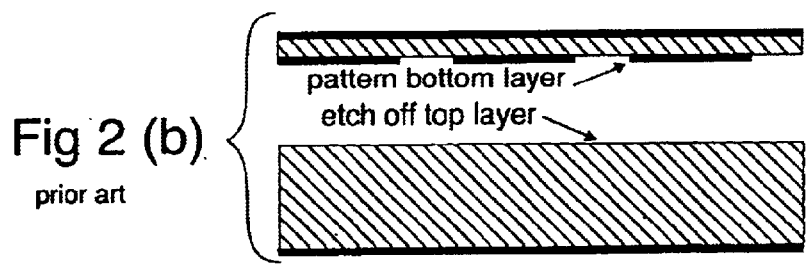
Fig 2 (b) prior art
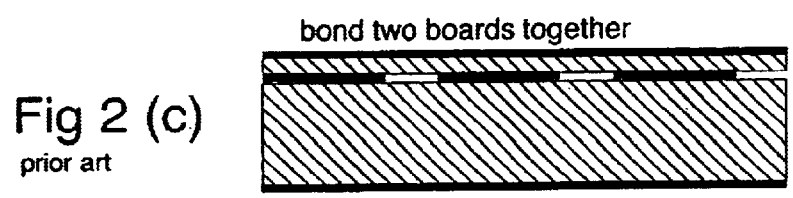
Fig 2 (c) prior art
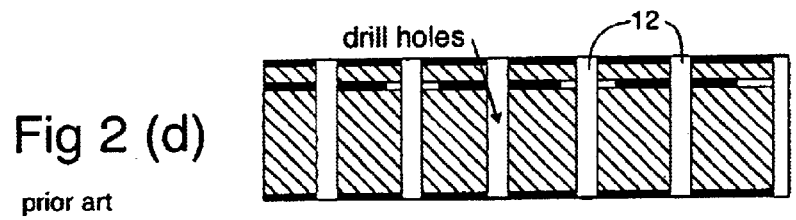
Fig 2 (d) prior art
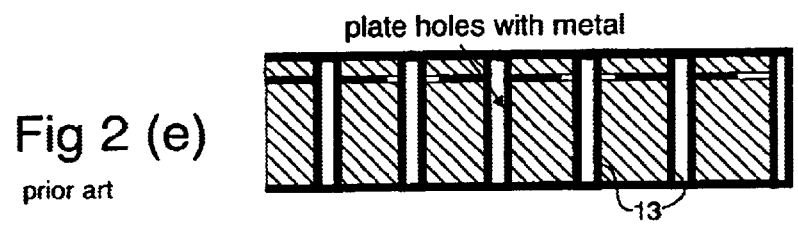
Fig 2 (e) prior art
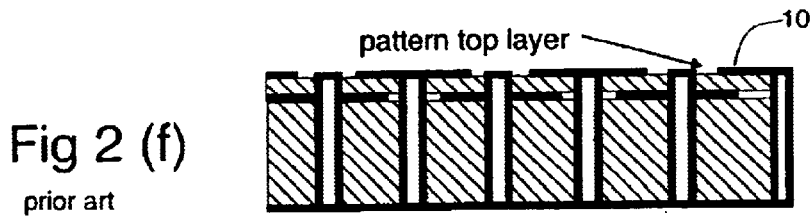
Fig 2 (f) prior art

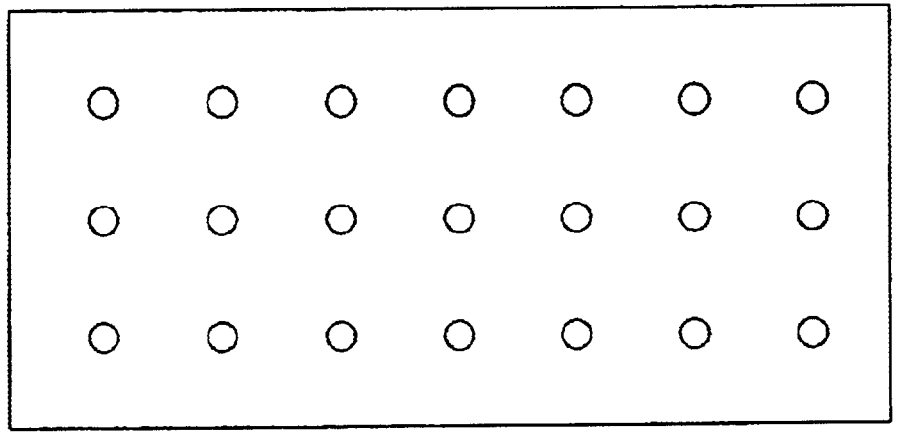
Fig 2 (g)    Prior Art
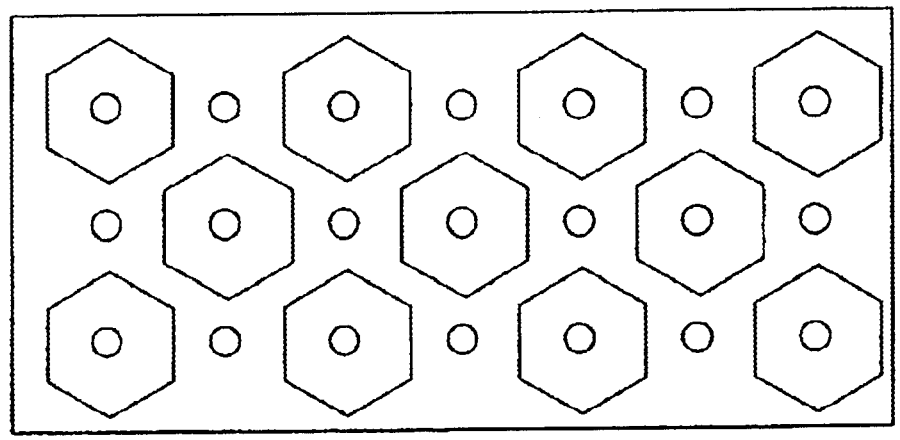
Prior Art
Fig 2 (h)

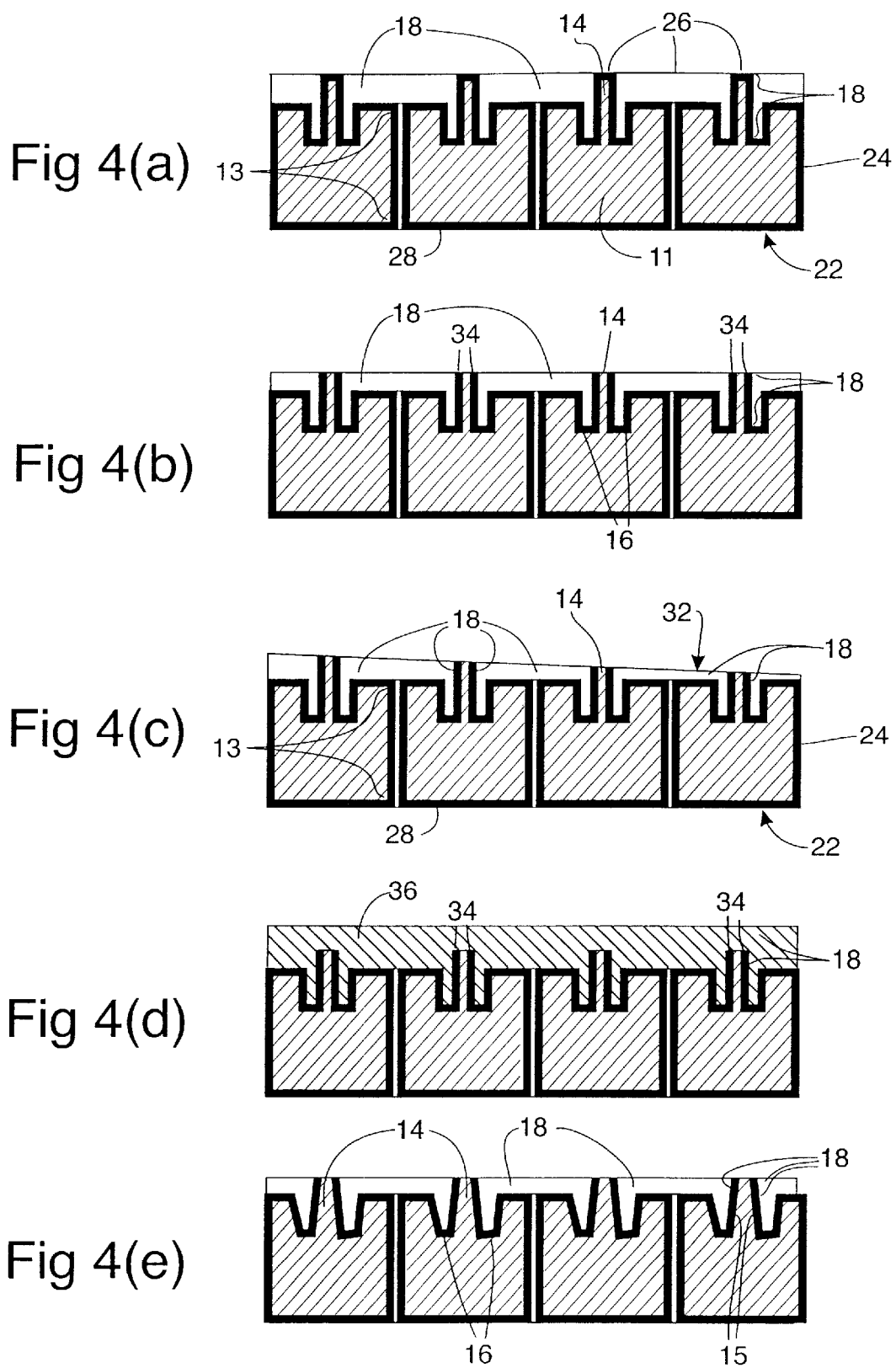

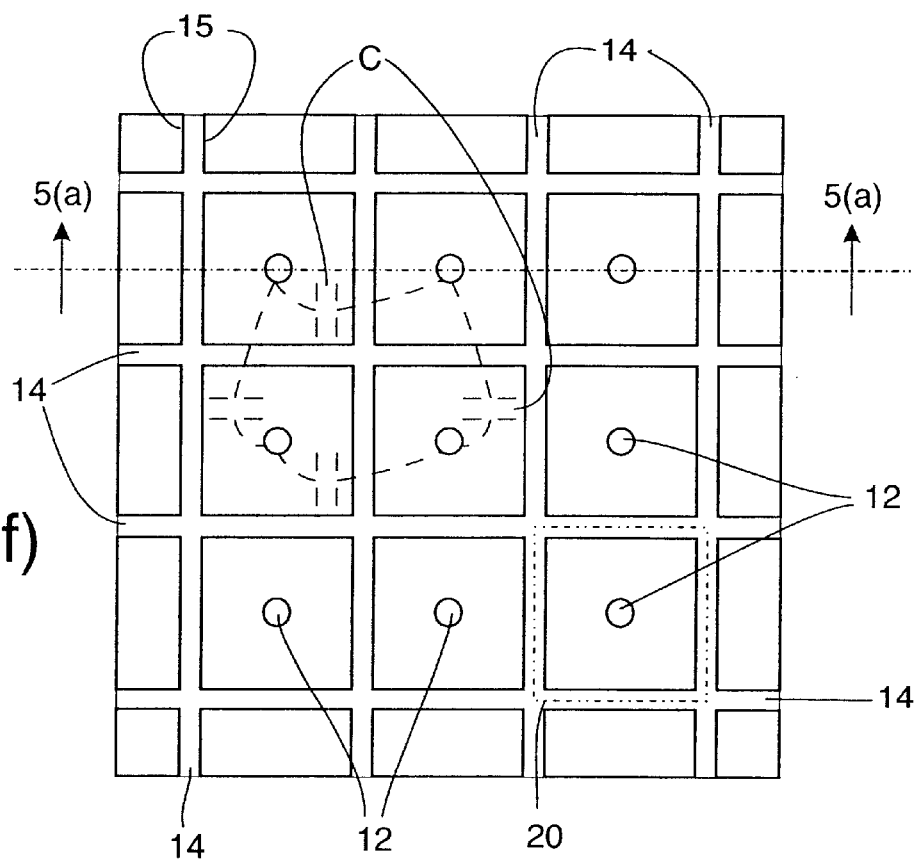

mold or press thick structure coat with metal and pattern flow solder

MOLDED HIGH IMPEDANCE SURFACE AND A METHOD OF MAKING SAME

TECHNICAL FIELD

This invention improves upon current techniques for manufacturing high impedance surfaces which surfaces are also known as resonant textured ground planes or a "Hi-Z" surfaces and which surfaces are presently made using printed circuit board techniques. The present invention provides new methods of manufacturing such surfaces based on molding and/or related techniques, and also provides several structures that are manufacturable using these techniques. The invention allows Hi-Z surfaces to be mass-produced more rapidly and at a lower cost than the prior art techniques, which primarily involve printed circuit board technology. This invention also provides a Hi-Z structure in which the capacitors are vertical, instead of horizontal, so that they may be trimmed after manufacturing, for tuning purposes.

BACKGROUND OF THE INVENTION

Recently, a new kind of electromagnetic ground plane has been developed which is known as a high-impedance or Hi-Z surface. See D. Sievenpiper and E. Yablonovitch, "Circuit and Method for Eliminating Surface Currents on Metals" U.S. provisional patent application, Serial No. 60/079,953, filed on Mar. 30, 1998 by UCLA and a related PCT application published as WO 99/50929 on Oct. 7, 1999. This prior art structure consists of a metal ground plane covered with an array of tiny resonant cavities. These resonant cavities alter the effective electromagnetic impedance of the surface, so that it appears to have a high impedance (>>377 ohms), instead of a low impedance ($\approx$0 ohm) like an ordinary metal surface. Because of its high impedance, the Hi-Z structure can support a finite tangential electric field at its surface, which is not possible with a smooth metal ground plane. This textured surface is important for various applications in the field of antennas. In particular, it is useful for low-profile antennas because radiating elements can be placed directly adjacent to the Hi-Z surface (i.e. spaced less than <<0.01 wavelength therefrom) without being shorted out. This provides an advantage compared to an ordinary metal ground plane, which normally requires a separation of roughly ¼ wavelength between the ground plane and the antenna, resulting in antennas that are at least ¼ wavelength thick. In addition to providing a way to produce very thin antennas, the Hi-Z surface also suppresses surface currents, which tend to interfere with the performance of the antenna by propagating across the ground plane and radiating from edges, corners, or other discontinuities. The radiation produced by these surface currents combines with the direct radiation from the antenna, and produces ripples in the radiation pattern, as well as significant radiation into the backward direction behind the ground plane. By suppressing these surface currents, one can produce antennas with much smoother radiation patterns, and with less backward radiation. In short, the antennas are both more compact and more efficient when made with a Hi-Z surface.

The Hi-Z structure can be most easily understood by considering the effective circuit that describes the resonant cavities. In the structure shown in FIG. 1, the Hi-Z surface is constructed as a lattice of overlapping "thumbtack"-like protrusions on a flat metal ground plane 22. The protrusion consist of flat metal plates 10 connected to the ground plane by metal plated vias 13. This prior art structure shown here is built using printed circuit board techniques. The printed circuit board is not shown for ease of illustration, but the flat metal plates 10 would appear on the printed circuit board's top surface while the ground plan 22 is disposed on its bottom surface. The capacitance of the structure is determined by the proximity and overlap area of the metal plates 10. The inductance is controlled by the area of the current loop that connects adjacent plates, which is primarily determined by the thickness of the structure. The resonance frequency of the surface is then given by $$\omega = \frac{1}{\sqrt{LC}}.$$

Near the resonance frequency, the surface has high impedance, and can suppress the propagation of surface currents. The bandwidth of the surface, or the frequency band where the impedance is greater than 377 ohms, is given by $$BW = \frac{\sqrt{L/C}}{\sqrt{\mu_o/\varepsilon_o}}.$$

This roughly determines the bandwidth of antennas that can be built on these surfaces.

Typically, in the prior art, Hi-Z surfaces are produced by printed circuit board techniques. In order to achieve a low resonant frequency (<10 GHz or so) in a thin structure (a few mm thick), a large amount of built-in capacitance is required. This is accomplished using a multi-layer structure, in which the capacitors are of a parallel-plate geometry. The vias 12 are made by drilling through both boards, and then plating the inside of the holes with metal 13. The steps taken in fabrication are shown in side elevation in FIGS. 2(a)–2(f). First, two printed circuit boards, one relatively thick and one relatively thin form the starting materials (see FIG. 2(a)). The inner layers are patterned (see FIG. 2(b)), and the boards are bonded together (see FIG. 2(c)). Then holes 12 are drilled through the structure to define the positions of the vias (see FIG. 2(d) and the plan view of FIG. 2(g)). These are then plated with metal 13 (see FIG. 2(e)). Finally, the outer layers are patterned (see FIG. 2(f) and the plan view of FIG. 2(h)). The most time-consuming and expensive task is drilling the vias 12. A fast computer-controlled drill can drill on the order of one hole per second. Typical lattice periods for these structures are on the order of ¼ inch, which means that the total drilling time can approach one hour per square foot.

What is needed is a method of producing a similar structure by faster and more economic techniques, in which the holes do not need to be drilled individually, but instead can be produced en masse by some other technique. This invention provides techniques for producing such a structure by molding, as well as new geometries that are amenable to such manufacturing techniques. The resulting structure is less expensive and less time-consuming to fabricate. Furthermore, it has the additional benefit that certain embodiments thereof can be tuned after fabrication to adjust for variations in the manufacturing process. This feature also allows a single mold to be used to build structures with slightly different resonant frequencies.

BRIEF DESCRIPTION OF THE INVENTION

The present invention provides a Hi-Z surface that can be produced by injection molding, which permits large areas to be produced rapidly and at a low cost. Additionally, certain embodiments of the structure are also technically superior in that they can be tuned after manufacturing, to adjust for variations in the manufacturing process, thus allowing a single mold to be used for structures with slightly different resonance frequencies, and/or allowing different areas of a single Hi-Z surface to be tuned to different resonance frequencies.

In one aspect the present invention provides a method of making a high impedance surface comprising the steps of: molding a structure from a dielectric material to form the structure, the structure having a plurality of holes therein and a plurality of ridges on at least one major surface of the structure, the ridges having sidewalls; plating the structure, including the interiors of the holes therein and the sidewalls, with a layer of metal; removing at least a portion of the layer of metal which bridges across the ridges to thereby define capacitor plates on the sidewalls.

In another aspect the present invention provides a method of making a high impedance surface comprising the steps of: molding a structure from a dielectric material to form the structure, the structure having a plurality of holes therein and a plurality of trenches on at least one major surface of the structure, the trenches having sidewalls and bottom walls; and plating the structure, including the interiors of the holes therein and the sidewalls, but not the bottom walls of the trenches, with a layer of metal.

In still yet another aspect the present invention provides a method of making a high impedance surface comprising the steps of molding a structure from a dielectric material, the structure having a first major surface, a second major surface, a plurality of holes which penetrate both major surfaces, and a plurality of sidewall features on the first major surface; and applying at least one metal layer to the structure in the interiors of the holes therein, on the sidewall features, and on the second major surface, the at least one metal layers on the sidewall features defining plates of capacitors which are connected to neighboring plates of capacitors via the at least one metal plate in the holes and on the second major surface.

In still yet another aspect the present invention provides a method of making a high impedance surface comprising the steps of molding a structure from sheet metal, the structure having a plurality of openings therein with confronting sidewalls on the sides of the openings, the structure also having a plurality of protrusions projecting from a major surface thereof; and joining the structure to additional sheet metal such that ends of the protrusions remote from the major surface are coupled to the additional sheet metal.

In yet another aspect the present invention provides a high impedance surface comprising a molded structure having a repeating pattern of holes therein and a repeating pattern of sidewall surfaces, the holes penetrating the structure between first and second major surfaces thereof and the sidewall surfaces joining the first major surface; and a metal layer on the molded structure, the metal layer being disposed in or filling the holes, covering at least a portion of the second major surface, covering the sidewalls and portions of the first major surface to interconnect the sidewalls with other sidewalls via the metal layer on the second major surface and in the holes.

BRIEF DESCRIPTION OF THE DRAWINGS

FIGS. 2(a)–2(f) depict the manufacturing steps used in making a prior art Hi-Z surface;

FIGS. 2(g) and 2(h) respectively depict a top view of a prior art Hi-Z surface during the manufacture thereof, FIG. 2(g) depicting a plan view of the partially manufactured prior art device shown in FIG. 2(d) and FIG. 2(h) showing a plan view of the prior art device shown in FIG. 2(f);

FIGS. 4(a)–4(c) show the structure of FIGS. 3(a) and 3(b) being covered by a metal and then the metal being partially removed to define the capacitor plates;

FIG. 4(d) shows the embodiment of FIG. 4(b) with an added planarization layer;

FIG. 4(e) depicts an alternative embodiment wherein the opposing capacitor plates formed on the sidewalls are non-parallel;

FIGS. 5(a)–5(f) depict another embodiment of a Hi-Z surface;

DETAILED DESCRIPTION OF A PREFERRED EMBODIMENT AND ALSO OF ALTERNATIVE EMBODIMENTS

Figure 1:
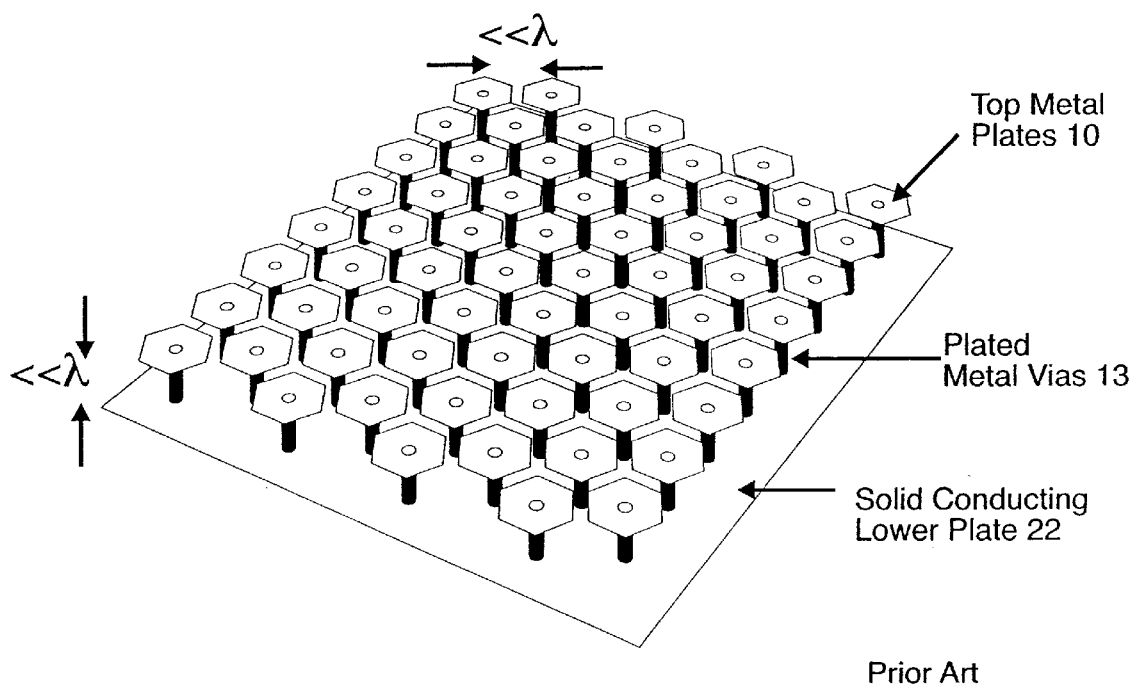
FIG. 1 depicts a prior art Hi-Z surface.
Figure 3A:
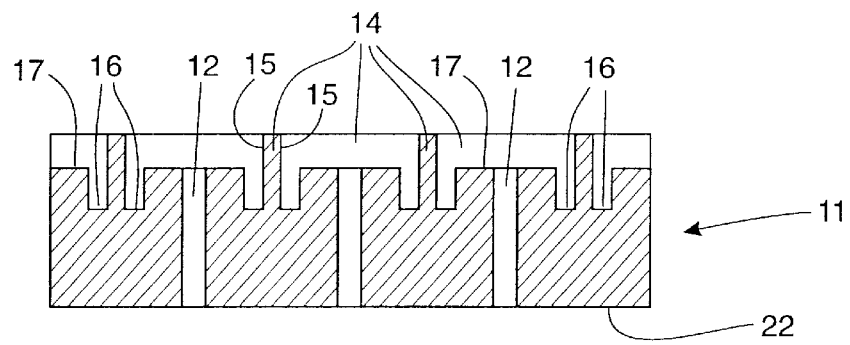
FIG. 3(a) is a side sectional view through a structure which acts as a form for making a Hi-Z surface in accordance with the present invention, the section line therefor being shown in FIG. 3(b)

A preferred embodiment of the present invention will now be described with reference to FIGS. 3(a) and 3(b) and FIGS. 4(a)–4(e). FIG. 3(a) is a cross section view through structure 11 as marked by section line 3(a) noted on FIG. 3(b). FIGS. 4(a)–4(e) are also section views taken along the same section line done for FIG. 3(a) but at later points in the fabrication of the high impedance surface of the present invention.

In this embodiment a form or structure 11 is fabricated by molding and the form 11 is subsequently plated with metal and the metal is partially removed to define the capacitor structures. The form or structure 11 is preferably made by injection molding, in which a mold is filled with a liquid dielectric material, which then hardens into a solid cast which is removed from the mold. This dielectric material is preferably either a thermoplastic, which is melted and then injected into the mold and allowed to harden, or a thermoset resin, which is mixed in liquid form from two reagents, injected into the mold, and then allowed to harden. The procedure for molding resins is known to those skilled in the art of injection molding and therefor is not discussed in further detail here. Important features of the molded structure 11 of this embodiment of the invention include preformed holes or vias 12, which can all be produced in the single molding step, and vertical raised projections or ridges 14 that will form a structure for supporting the plates of the capacitors. These projections or ridges 14 may be optionally recessed into the structure 11 by using a trench 16 as shown in FIG. 3(a). The sidewalls 15 of the ridges 14 may be parallel to each other in this embodiment so the capacitors which will be formed thereon will then have parallel plates. As will be seen, the sidewalls 15 can alternatively be trapezoidal in cross section in order to from non-parallel plate capacitors.

The trenches 16 in this embodiment are optional and are used to make the structure 11 as thin as reasonably possible.

The trenches 16 allow some or all of the capacitors to be recessed somewhat into the structure 11. If not for the trenches 16, the entire length of each capacitor would extend above the top major surface of the depicted structure and the height of the structure 11 would be taller. As such, the trenches 16 help make the structure 11 thinner.

Figure 3B:
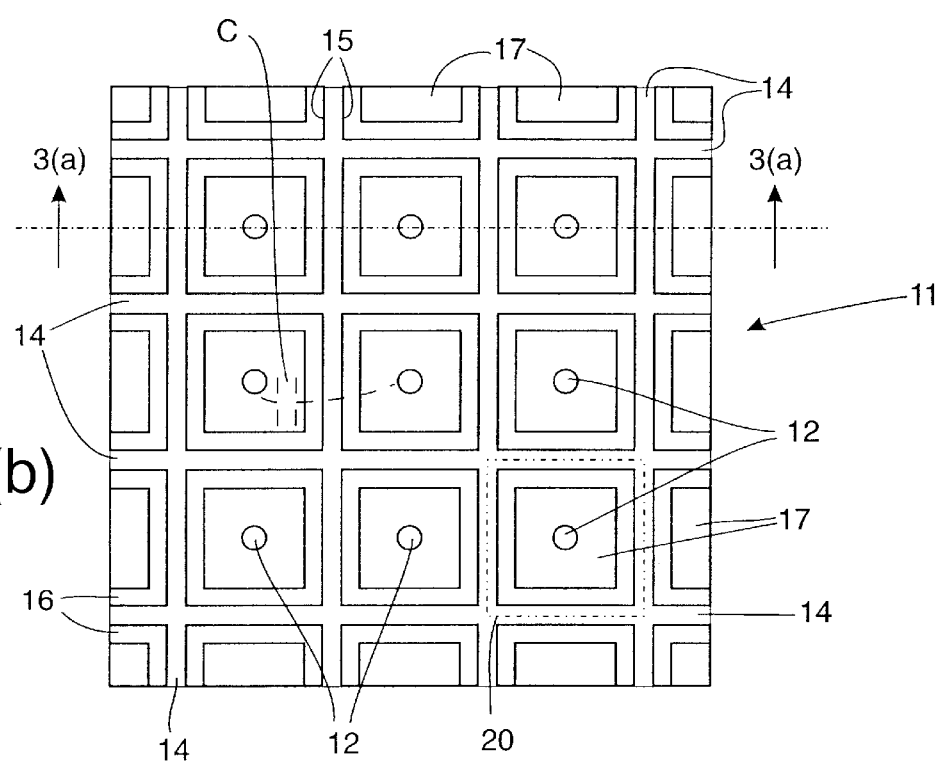
FIG. 3(b) is a plan view of the structure shown in FIG. 3(a)

The resulting structure 11 includes a grid of projections or ridges 14, which may be square shaped, when viewed in plan view (see FIG. 3(b)), or the grid may be hexagonal, triangular, or have any other desired shape or pattern when viewed in plan view. Moreover, the projections or ridges 14 may have parallel sidewalls 15 as depicted in FIGS. 3(a) and 3(b) or may have somewhat non-parallel sidewalls to ease removal of the structure 11 from its mold. The ridges 14 form cells 20 and each cell surrounds a region containing: (i) a hole or via 12 that extends to the back side 22 of the structure 11 and (ii), in the depicted embodiment, four adjacent sidewalls 15. In FIGS. 3(a) and 3(b) only nine complete cells 20 are shown, but it is to be understood that a complete structure 11 would normally comprise hundreds or thousands or even more of such cells 20. Each cell 20 will help define one of the plates 18 (see FIG. 4(b)) of four capacitors (an electrically equivalent capacitor C is depicted in phantom in FIG. 3(b)) associated with each vertical connection 13 to be formed in the hole or via 12 of the resulting Hi-Z surface.

Turning now to FIG. 4(a), after the structure 11 of FIGS. 3(a) and 3(b) has been formed, preferably by molding, it is plated with thin layer of metal 24, preferably copper. The copper may be coated with another metal such as nickel, tin, or gold to provide corrosion resistance, if desired.

Preferably, the entire exterior surface of structure 11 is plated, including the back side 22, the holes 12, and the features 14, 16 on the front side thereof with metal 24. The thickness of metal 24 is not critical and might typically be 50 μm or so. The metal that is plated inside the holes 12 creates vertical connections 13 between the metal on the back side 22 (which will form a ground plane) and the capacitor plates to be defined on the sidewalls 15 of each cell 20 (see FIG. 3(b)). The vertical connections 13 are used to suppress surface waves is certain embodiments. Those skilled in the art will appreciate the fact that the vertical connections 13 can sometimes be omitted and in such embodiment the holes 12 can be omitted. The metal that is plated on the sides 15 of the vertical ridges 14 forms vertical capacitor plates 18. The dielectric of the ridges 14 forms the insulator for the capacitors. If the holes 12 have a sufficiently small diameter, the vertical connections 13 may completely fill holes 12.

The next fabrication step is to pass the structure through a planing device, which removes or planes off the tops of the projections or ridges 14 as can be seen in FIG. 4(b). This action removes the metal connections or bridges 26 (see FIG. 4(a)) at the tops of the ridges 14 and between adjacent cells 20, so that the plates 18 of the individual cells 20 are now electrically coupled by the metal plating 13 in holes 12 only to the lower metal surface 28. This step is important for the creation of the capacitors and it also provides tunability to the structure, since the capacitors can be planed to a desired depth, which determines the resonance frequency of the resulting structure. Also, assuming that the structure is not planed to too great a depth initially, the technique of removing the tops of the ridges 14 allows for fine-tuning the capacitance of the resulting structure after other fabrication steps have been performed to correct for variations in manufacturing tolerances. Furthermore, different areas of the surface can be optionally planed to different depths, to create a surface with areas having different resonance frequencies. This allows a single surface to be used for multiple bands of operation. As an alternative, the structure can also be planed or originally molded with a built-in taper 32, as is shown in FIG. 4(c), so that the resonance frequency varies smoothly across the surface where such a taper is provided. In this embodiment each capacitor ridge 14 has a slightly different average height compared to its neighbors. This makes the resonant ground plane surface useful for broadband operation by feeding various areas of the surface with different antennas according to the desired frequency of interest. The ability to tune the surface as a function of position may also have applications in producing low-angle radiation from a low-profile antenna, as energy can be coupled into surface waves, which are then allowed to radiate off the surface after a pre-determined distance. With any of these surfaces, the final structure may be coated with a dielectric layer 36 for purposes of planarization, so that the possibly delicate fins 34 that form the capacitors are not damaged in use. See FIG. 4(d) which shows the embodiment of FIG. 4(b) with the added dielectric layer 36. The fins 34 may be delicate since their sizes are dictated by the frequency at which the resonant surface is to be resonant and when the resonant frequency gets into the gigahertz range the feature sizes of the capacitors is rather small (easily viewable by the human eye, but sufficiently small that the fins 36 may be delicate and therefore it may be desirable to protect them from physical damage.

The embodiments depicted by FIGS. 4(b) and 4(c) both have parallel plate 18 capacitors. As can be seen from FIG. 4(e), if the ridges 14 are trapezoidal in cross section when formed, then the capacitor plates 18 will be non-parallel. The trenches 16 may also be formed with non-parallel walls. This embodiment has the advantage that the structure 11 more easily releases from its mold (not shown) when molded. As such, non-parallel plate capacitors are preferred for ease of manufacturing. The amount by which the plates are non-parallel may be rather slight and preferably would only be by an amount needed for ease of manufacturing since non-parallel plate capacitors tend to make determining the shape of the taper 32 more complicated (if a taper 32 is utilized). The use of a taper tends to reduce the capacitance towards the wide end of the taper thereby requiring taller capacitors in compensation therefor.

Figure 5A:
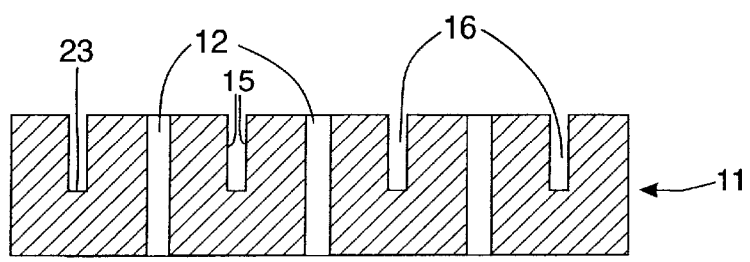

Another technique for producing a Hi-Z structure will now be described with reference to FIGS. 5(a)–5(f). This embodiment involves building vertical capacitors into the structure in connection with downward-pointing trenches 16. The trenches 16 have sidewalls 15 where the plates 18 of the capacitors will be formed and also have trench bottoms 23 which will be free of metal when the Hi-Z surface of this embodiment is completely built. In this embodiment, a structure 11 is molded which bears some resemblance to the structure 11 of FIGS. 3(a) and 3(b). FIG. 5(a) is a cross section view taken through structure 11 along section line 5(a) in the plan view depicted by FIG. 5(f). In this embodiment there is no need for ridges 14—rather a grid of trenches 16 is formed when molding the structure 11.

Figure 5B:
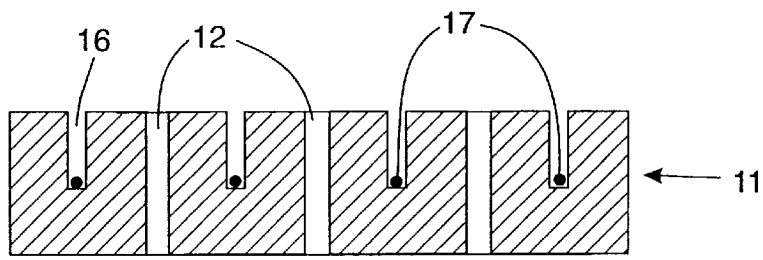
Figure 5C:
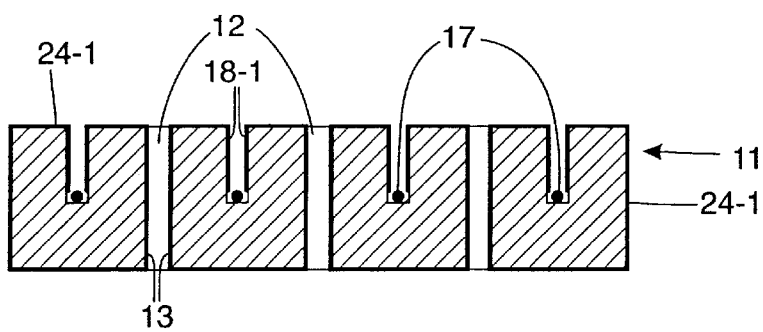
Figure 5D:
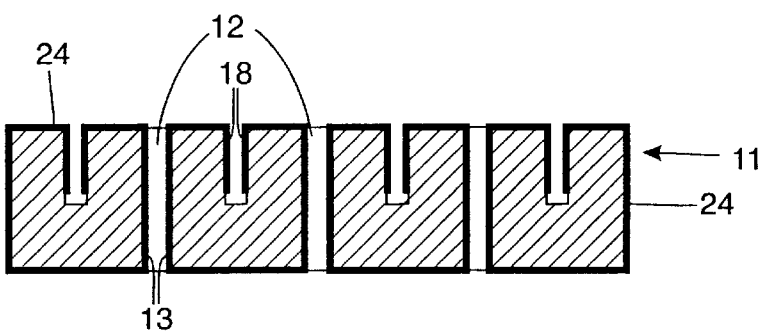
Figure 5E:
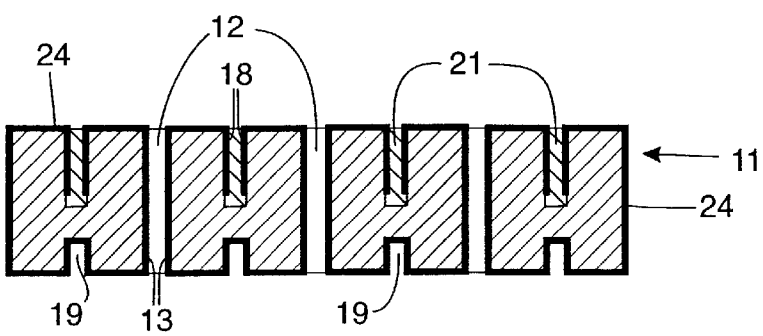
Figure 6A:
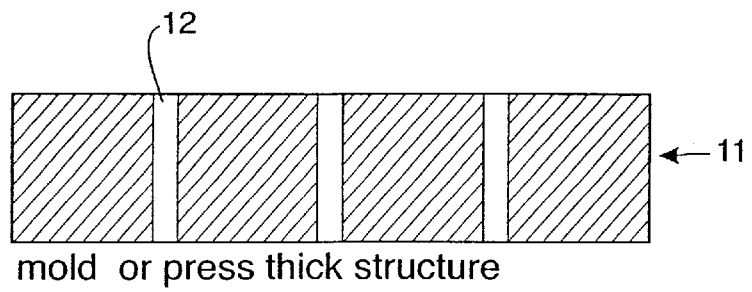
FIGS. 6(a)–6(e) depict still another embodiment of a Hi-Z surface.
Figure 6B:
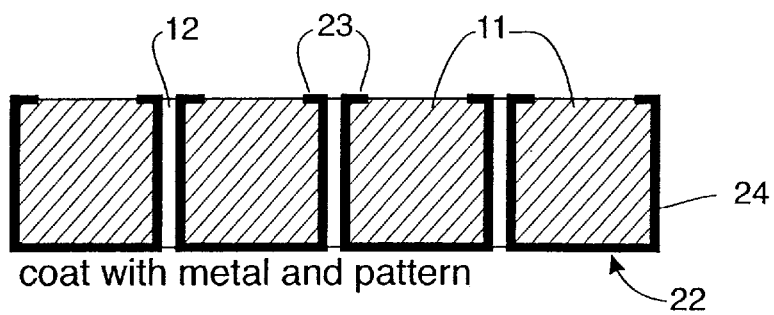
Figure 6C:
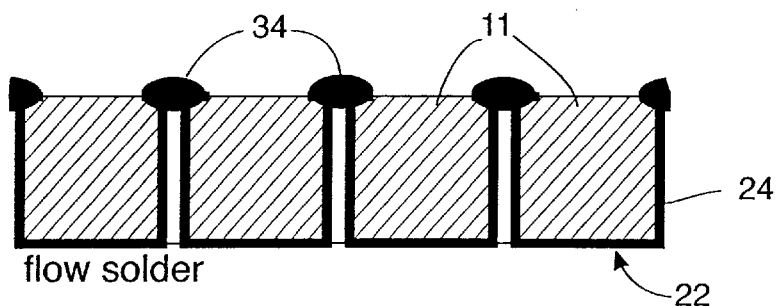
Figure 6D:
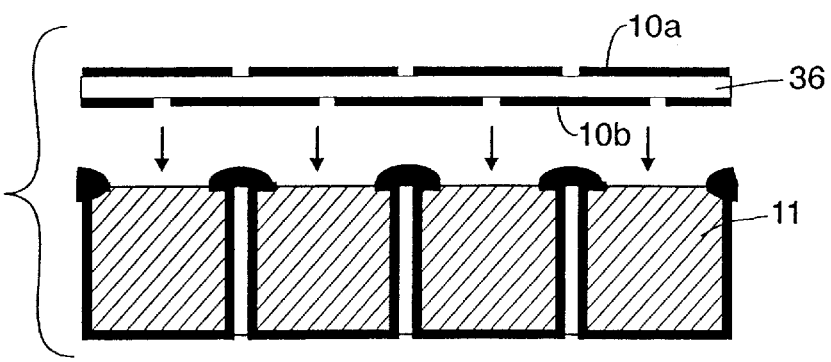
Figure 6E:
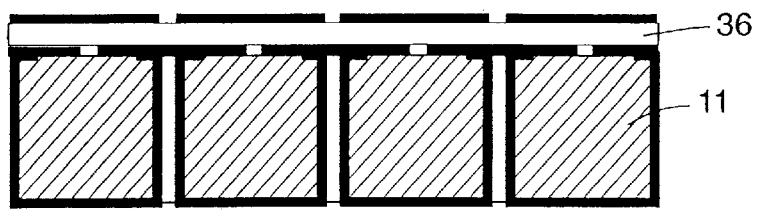
Figure 7A:
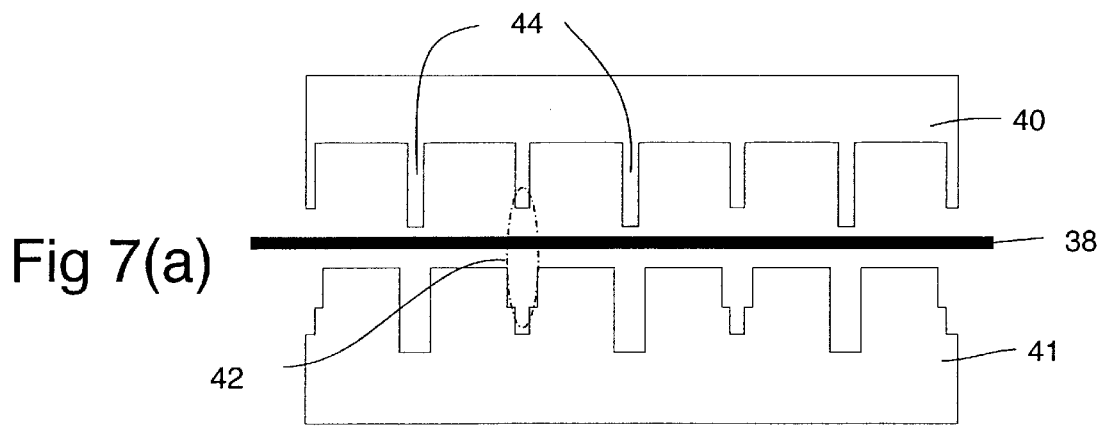
FIGS. 7(a)–7(d) depict yet another embodiment of a Hi-Z surface.
Figure 7B:
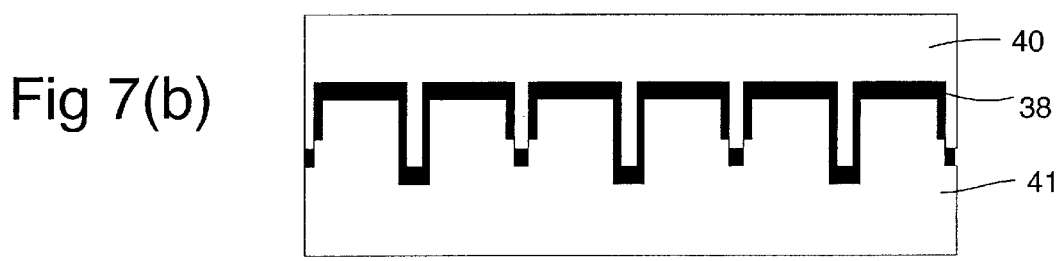
Figure 7C:
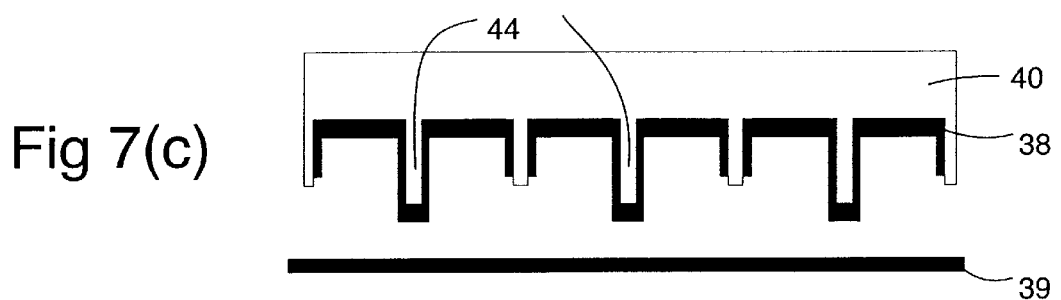
Figure 7D:
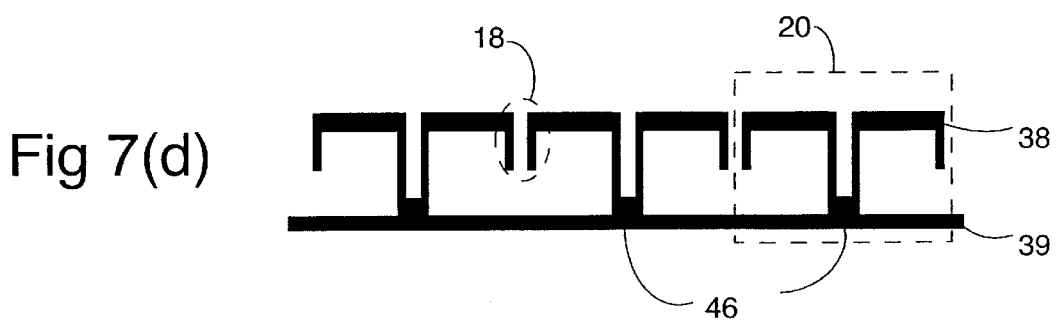

Turning to FIG. 5(b), a wire grid 17 is laid into the trenches 16 to prevent the capacitors from being shorted out when the structure 11 is coated with a layer 24 of metal. Layer 24 is preferably formed by first evaporating a thin metal layer 24-1 onto structure 11, covering every part of the surface except that which is covered by the wire grid 17 as shown by FIG. 5(c). For this initial metal layer evaporation, it is preferable to evaporate a metal that has low thermal conductivity and that can provide a base for electroplating more metal. Nickel is a common choice for an evaporated metal. After the evaporation step, the wire grid 17 is removed. The aforementioned metal evaporation step preferably lays down a very thin layer of metal 24-1 which will not form a connection across junctions where there is no line-of-sight from the evaporation source. Hence, the wire grid 17 will not become attached to metal 18-1 on the sidewalls 15 of the trenches 16 as long as the diameter of the wires of grid 17 is somewhat smaller than the width of the trenches 16.

After evaporation and wire grid removal, other metals are preferably electroplated onto the exposed metal as shown by FIG. 5(*d*) forming a thicker metal layer 24 (and thicker metal 18 on the sidewalls of the trenches 16). The first metal which is preferably electroplated to the exposed nickel (for example) layer 24-1 is a metal layer having a high electrical conductivity (such as copper). The exposed high conductivity metal layer (preferably copper) is then preferably covered with another layer that will provide corrosion resistance. Nickel, tin, or gold are common choices for metals for the corrosion resistant layer. The initial layer 24-1 and the added layers of a low thermal conductivity metal (preferably nickel), a high electrical conductivity metal (preferably copper) and a corrosion resistance layer (preferably nickel, tin or gold) are collectively identified as layer 24 in FIGS. 5(*d*) and 5(*e*).

The resulting structure of FIG. 5(*d*) contains the capacitor plates 18 formed from the metal coated on the sidewalls of the trenches 16 as well as the vertical connections 13 formed in the vias 12. Turning now to FIG. 5(*e*), trenches 19 may also built into the bottom of structure 11, forming an "inverse waffle" structure, which would have improved mechanical flexibility. In this case, the capacitors should be filled with a dielectric 21 so that their capacitance will not change when the Hi-Z surface is bent or flexed. This embodiment has several drawbacks compared to the preferred embodiments of FIGS. 3(*a*), 3(*b*) and 4(*a*)–4(*e*), including lack of tunability, and sensitivity to flexing unless the air capacitors are filled with dielectric 21.

In FIG. 5(*f*) only nine complete cells 20 are shown, but it is to be understood that the structure 11 would normally comprise hundreds or thousands or more of such cells 20. Each cell 20 will help define one of the plates 18 of four capacitors (an electrically equivalent capacitor C is depicted in phantom in four places in FIG. 5(*f*)) associated with each vertical connection 13 of the resulting Hi-Z surface.

For the preferred embodiments of FIGS. 3(*a*), 3(*b*) and 4(*a*)–4(*e*), the capacitors are filled with a dielectric. If the dielectric is relatively inelastic, then if the surface is bent or flexed, it is the width of the trenches that will change, and not the width of the capacitors. In the case of the wire grid constructed embodiment of FIGS. 5(*a*)–5(*d*), the capacitors may be only filled with air, while the rest of the structure is filled with dielectric. If this structure is bent or flexed, then the regions filled with the most compressible material (air) will be the regions that are deformed. This would result in a large change in capacitance in response to bending the surface. For most applications, such a change in capacitance is undesirable and, for this reason, it is usually important to fill the capacitors with another material 21 that is preferably less elastic than the plastic which provides the rest of the structure if (1) the structure is subject to bending or flexing and (2) having the structure change capacitance in response thereto would be undesirable.

Yet another embodiment of a Hi-Z structure is now described with reference to FIGS. 6(*a*)–6(*e*). This embodiment takes advantage of the fact that the capacitive metal plates of the Hi-Z surface are easy to fabricate using photolithography and standard printed circuit board techniques, while the vias are easy to produce en masse using injection molding techniques. This Hi-Z structure is made by a hybrid of two technologies: injection molding and printed circuit technology. Turning to FIG. 6(*a*), the lower part of the Hi-Z surface is a structure 11 with vias 12 is fabricated using injection molding technology. Alternatively the vias 12 could be stamped into a substrate or formed therein using an array of pins or drills. As is shown by FIG. 6(*b*), the structure 11 is then coated with metal, preferably copper, to make the back side 22 and the vias 12 conductive, and then patterned to remove metal from the front side except from pads 23 adjacent vias 12 which pads 23 will be used for solder bonding. Solder is then flowed onto the front of the structure to form solder bumps 34 on the tops of the pads 23 adjacent vias 12 (see FIG. 6(*c*)). A second layer of dielectric 36, which is preferably provided by a printed circuit board 36, is patterned using standard photolithographic processing to pattern the metal disposed thereon as is shown by FIG. 6(*d*) to form an array of plates 10*a* on an upper surface thereof and an array of plates 10*b* on the lower surface thereof. The structure of FIG. 6(*c*) and the patterned printed circuit board 36 are aligned and the two structures 11, 36 are heated to bond them together as is shown in FIG. 6(*e*). The resulting Hi-Z surface has the advantage that the capacitors can be easily defined by photolithographic processing of the metal on printed circuit dielectric 36, while the vias 12 can be easily formed when structure 11 is formed by injection molding. This hybrid structure takes advantage of the strengths of each fabrication method. The final structure can later be coated with tin, nickel, or gold for corrosion resistance, if desired.

Instead of forming structure 11 by injection molding, structure 11 of any of the previously described embodiments can be formed from a pre-fabricated sheet of dielectric which is processed with a hot press, in which an array of hot metal pins are forced through the structure to form the holes and other surfaces are used to form any trenches or projecting walls needed. Like injection molding, this technique has the advantage that many holes can be formed quickly. The hot press method has the additional advantage that it uses a preformed dielectric sheet, in which the thickness can be specified very accurately.

Still another embodiment of a Hi-Z surface is now described with reference to FIGS. 7(*a*)–7(*d*). In this embodiment metal stamping is used to make a low-cost Hi-Z surface by forming the capacitors and vias in a single stamping process of a metal sheet 38. FIG. 7(*a*) depicts a mold having reciprocating mold surfaces 40 and 41 for forming the shape of the desired structure, which mold surfaces include regions 42 to shear off certain areas of the sheet metal to help define the plates 18 of the capacitors. The mold also includes elongated regions 44 that form vertical protrusions 45 in the sheet metal.

The mold is used to stamp the sheet 38 as shown by FIG. 7(*b*). This stamped sheet metal 38 is then removed from one section of the mold and applied (see FIGS. 7(*c*) and 7(*d*)) to a second flat sheet of metal 39, to which it is then connected by soldering or spot welding at points 46 where the two sheets meet. The completed structure can then be filled with a dielectric for mechanical support, if desired. One cell 20 is depicted by phantom line 20 and a typical capacitor is depicted by reference number 18. In plan view the completed structure would comprise hundreds or thousand or more of such cells. The cells 20 in this embodiment would have a square shape in plan view, but other shapes could be used just as well as a matter of design choice.

In all of the embodiments disclosed herein, only a few capacitors are depicted since the figures depict the structures considerably enlarged for ease of understanding and illustration. It is to be understood that a typical Hi-Z surface will have hundreds, thousands or even more capacitors. The terms ridges and projections are used herein synonymously to refer to element 14.

Common reference numbers are sometimes used herein to refer to objects which have similar features and/or functions, but which may not be identical to each other.

Having described the invention in connection with certain preferred embodiments thereof, modification will now certainly suggest itself to those skilled in the art. The invention is not to be limited to the disclosed embodiments, except as is specifically required by the appended claims

What is claimed is:

1. A method of making a high impedance surface comprising the steps of:
    (a) forming a structure from dielectric material, the structure having a plurality of projections on at least one major surface of the structure, the projections having sidewalls;
    (b) plating said structure, including said sidewalls, with a layer of metal;
    (c) removing at least a portion of the layer of metal which bridges across said projections to thereby define capacitor plates on said sidewalls.

2. The method of claim 1 wherein the structure is formed with a plurality of holes penetrating the structure therein and wherein the plating step includes plating interiors of the holes.

3. The method of claim 1 wherein the structure is made by molding and wherein the dielectric material is a thermoplastic or a thermoset resin.

4. The method of claim 1 wherein trenches are formed in said dielectric material adjacent said projections.

5. The method of claim 1 wherein the removing step includes moving at least a portion of at least some of said projections.

6. The method of claim 1 wherein said projections define a repeating geometric pattern.

7. The method of claim 6 wherein the repeating geometric pattern is a pattern of square-shaped cells.

8. The method of claim 1 wherein the removing step adjusts the height of the projections as a function of location.

9. A method of making a high impedance surface comprising the steps of:
    (a) forming dielectric material to define a structure of the dielectric material, the structure having a plurality of trenches on at least one major surface of the structure, the trenches having sidewalls and bottom walls; and
    (b) plating said structure, including said sidewalls, but not the bottom walls of said trenches, with a layer of metal.

10. The method of claim 9 wherein the structure is formed with a plurality of holes therein and wherein the plating step includes plating the interiors of the holes.

11. The method of claim 10 wherein said trenches define a repeating geometric pattern.

12. The method of claim 11 wherein the repeating geometric pattern is a pattern of square-shaped cells.

13. The method of claim 10 further including the step of inserting a plating inhibiting material adjacent the bottom walls of said trenches, said step of plating inhibiting material occurring before the plating step is carried out.

14. The method of claim 13 further including the step of removing the plating inhibiting material adjacent the bottoms of said trenches after said sidewalls have been plated.

15. A method of making a high impedance surface comprising the steps of:
    (a) forming a structure from a dielectric material, the structure having a first major surface, a second major surface, a plurality of holes which penetrate both major surfaces, and a plurality of sidewall features on said first major surface; and
    (b) applying at least one metal layer to said structure in the interiors of the holes therein, on said sidewall features, and on said second major surface, the at least one metal layer on said sidewall features forming at least portions of plates of capacitors which are connected to neighboring plates of capacitors via the at least one metal layer in said holes and on said second major surface.

16. The method of claim 15 wherein the sidewall features are defined by forming protruding surfaces in said first major surface.

17. The method of claim 15 wherein the sidewall features are defined by forming trenches surfaces in said first major surface.

18. The method of claim 15 wherein the at least one metal layer, when first applied to said structure, covers said structure entirely and thereafter at least one portion of said at least one metal layer is removed to define individual plates of said capacitors.

19. The method of claim 15 wherein the at least one metal layer when first applied to said structure does not cover said structure entirely and is inhibited from covering at least portions of said structure to define thereby individual plates of said capacitors.

20. The method of claim 15 wherein said sidewall features define a repeating geometric pattern.

21. The method of claim 20 wherein the repeating geometric pattern is a pattern of square-shaped cells.

22. The method of claim 15 wherein the structure is a molded structure and the dielectric material is a thermoplastic or a thermoset resin.

* * * * *